United States Patent [19]
Watanabe

[11] Patent Number: 5,903,019
[45] Date of Patent: May 11, 1999

[54] SEMICONDUCTOR DEVICE HAVING A PLURALITY OF INPUT/OUTPUT CELL AREAS WITH REDUCED PITCHES THEREBETWEEN

[75] Inventor: Masatoshi Watanabe, Kasugai, Japan

[73] Assignee: Fujitsu Limited, Kawasaki, Japan

[21] Appl. No.: 08/859,036

[22] Filed: May 20, 1997

[30] Foreign Application Priority Data

Sep. 24, 1996 [JP] Japan .................................. 8-251765

[51] Int. Cl.$^6$ .................................................. H01L 27/10
[52] U.S. Cl. .......................................... 257/208; 257/203
[58] Field of Search ..................................... 257/202–211

[56] References Cited

U.S. PATENT DOCUMENTS

| | | | |
|---|---|---|---|
| 4,992,845 | 2/1991 | Arakawa et al. | 257/203 |
| 5,300,796 | 4/1994 | Shintani | 257/203 |
| 5,347,150 | 9/1994 | Sakai et al. | 257/207 |
| 5,386,129 | 1/1995 | Koizumi | 257/207 |
| 5,404,035 | 4/1995 | Taniguchi et al. | 257/207 |
| 5,485,026 | 1/1996 | Hanibuchi | 257/205 |

*Primary Examiner*—David B. Hardy
*Attorney, Agent, or Firm*—Armstrong, Westerman, Hattori, McLeland & Naughton

[57] ABSTRACT

A semiconductor device that reduces the pitch between adjacent I/O cell areas is disclosed. The semiconductor device permits more I/O cell areas to fit on an outer periphery of the semiconductor device by reducing the width of I/O cell areas. Hence, the semiconductor device is able to support a large number of external connection pins on the semiconductor device.

21 Claims, 8 Drawing Sheets

SEMICONDUCTOR DEVICE HAVING A PLURALITY OF INPUT/OUTPUT CELL AREAS WITH REDUCED PITCHES THEREBETWEEN

BACKGROUND OF THE INVENTION

1. Field of the Invention

The present invention relates generally to a semiconductor device. More particularly, the invention relates to a semiconductor device having a plurality of input/output cell areas.

2. Description of the Related Art

One demand for highly integrated semiconductor devices is to increase external connection pins which are associated with a plurality of circuits in a semiconductor chip. The external connection pins are connected to input/output (I/O) external pads located on the peripheral area of a semiconductor chip along the edges of the semiconductor chip. It is therefore necessary to shorten the pitch between the adjacent I/O external pads. The individual I/O external pads are also connected to associated input/output circuits. Each input/output circuit is located in an associated one of a plurality of I/O cell areas defined on the peripheral area of the semiconductor chip inward of the associated I/O external pad. It is thus necessary to reduce the widths of the I/O cell areas or the lengths of the I/O cell areas extending along the edges of the semiconductor chip.

FIG. 1 shows a conventional output circuit 101 provided in one I/O cell area 100 on a CMOS gate array. The output circuit 101 includes four nMOS transistors 102 and four pMOS transistors 103. The portions of the nMOS transistors 102 and the pMOS transistors 103 illustrated in FIG. 1 are the gates of the individual MOS transistors.

Each pair of the nMOS transistor 102 and the pMOS transistor 103 are arranged in a row along (or in the lengthwise direction of) the I/O cell area 100. Specifically, the gate, source and drain (the source and drain not shown) of each nMOS transistor 102 are formed to extend along (or in the lengthwise direction of) the I/O cell area 100. The gate, source and drain (the source and drain not shown) of each pMOS transistor 103 are also formed to extend along the I/O cell area 100.

First aluminum lines 104 are located over the sources of the respective nMOS transistors 102. Each first aluminum line 104 is formed in a first metal interconnection layer so as to extend along the associated I/O cell area 100. Located over the first aluminum lines 104 is a first aluminum power line 106 to which a low-potential supply voltage ($V_{SS}$) is supplied. The first aluminum power line 106 is formed in a second metal interconnection layer so as to extend across (or in the width direction of) the associated I/O cell area 100. The sources of the individual nMOS transistors 102 are electrically connected to the first aluminum power line 106 via the associated first aluminum lines 104.

Second aluminum lines 105 are located over the sources of the respective pMOS transistors 103. Each second aluminum line 105 is formed in the first metal interconnection layer so as to extend along the associated I/O cell area 100. Located over the second aluminum lines 105 is a second aluminum power line 107 to which a high-potential supply voltage ($V_{DD}$) is supplied. The second aluminum power line 107 is formed in the second metal interconnection layer so as to extend across the associated I/O cell area 100. The sources of the individual pMOS transistors 103 are electrically connected to the second aluminum power line 107 via the associated second aluminum lines 105.

Third aluminum lines 108 are located over the drains of the nMOS transistors 102 and the pMOS transistors 103. Each third aluminum line 108 is formed in a first metal interconnection layer so as to extend along the associated I/O cell area 100. The drains of the nMOS transistors 102 and the pMOS transistors 103 are electrically connected to the respective external pad (not shown) via the associated third aluminum lines 108.

As mentioned above, multiple first to third aluminum lines 104, 105 and 108 and also gate contact lines (not shown) are formed in the first metal interconnection layer so as to extend along the I/O cell areas 100. This makes it difficult to reduce the widths CW0 of the I/O cell areas 100.

It is also necessary to provide sufficient intervals between the third aluminum line 103 and the first and second aluminum lines 104 and 105 to avoid the mutual contact. The third aluminum lines 108 have relatively wide widths W0 to improve the electromigration resistance. The restrictions on the first to third aluminum lines 104, 105 and 108 lead to an increase in the widths CW0 of the I/O cell areas 100. As a result, it is difficult to shorten the pitch between the adjoining I/O cell areas 100. In other words, the pitch between the adjoining I/O cell areas 100 becomes greater than the pitch between the adjoining pads.

Thus, there is a need for a semiconductor device having reduced pitch between I/O cell areas.

SUMMARY OF THE INVENTION

Broadly speaking, the present invention relates to a semiconductor device that reduces the pitch between adjacent I/O cell areas. In one embodiment, the present invention permits more I/O cell areas to fit on an outer periphery of the semiconductor device by reducing the width of I/O cell areas, and thus facilitates support for a large number of external connection pins on the semiconductor device. The present invention can be implemented in numerous ways including as an apparatus and a method.

As a semiconductor device, a first embodiment of the invention includes: a semiconductor chip body having a surface; a plurality of input/output cell areas arranged on the surface of the semiconductor chip body; and input/output circuits respectively formed in the input/output cell areas and each having a plurality of transistors with three electrodes. The transistors are arranged in a row across the associated input/output cell area, and the three electrodes of each of the transistors being arranged in a row across the associated input/output cell area.

As a semiconductor device, a second embodiment of the invention includes: a semiconductor chip package having a surface; a plurality of input/output cell areas arranged on an outer periphery of the surface of the semiconductor chip package; and input/output circuits respectively formed in the input/output cell areas and each having a plurality of transistor groups including first and second transistor groups, each of the first and second transistor groups including transistors with three electrodes. The first and second transistor groups being arranged in a row along the associated input/output cell area, the transistors in the first and second transistor groups being arranged in a row across the associated input/output cell area, and the three electrodes of each of the transistors being arranged in a row across the associated input/output cell area.

Optionally, the semiconductor device according to the first or second embodiments may further include a first line, electrically connected to a first electrode among the three electrodes of each of the transistors, for supplying a predetermined supply voltage to the transistors. The first line is formed over the surface of the semiconductor chip body so as to extend across the associated input/output cell area. Still further, the semiconductor device according to the first embodiment may include: a second line electrically connected to a second electrode among the three electrodes of each of the transistors and formed over and substantially perpendicular to the first line, and an I/O pad electrically connected to the second line.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor device according to the first embodiment of the present invention will now be described referring to the accompanying drawings.

Figure 1:
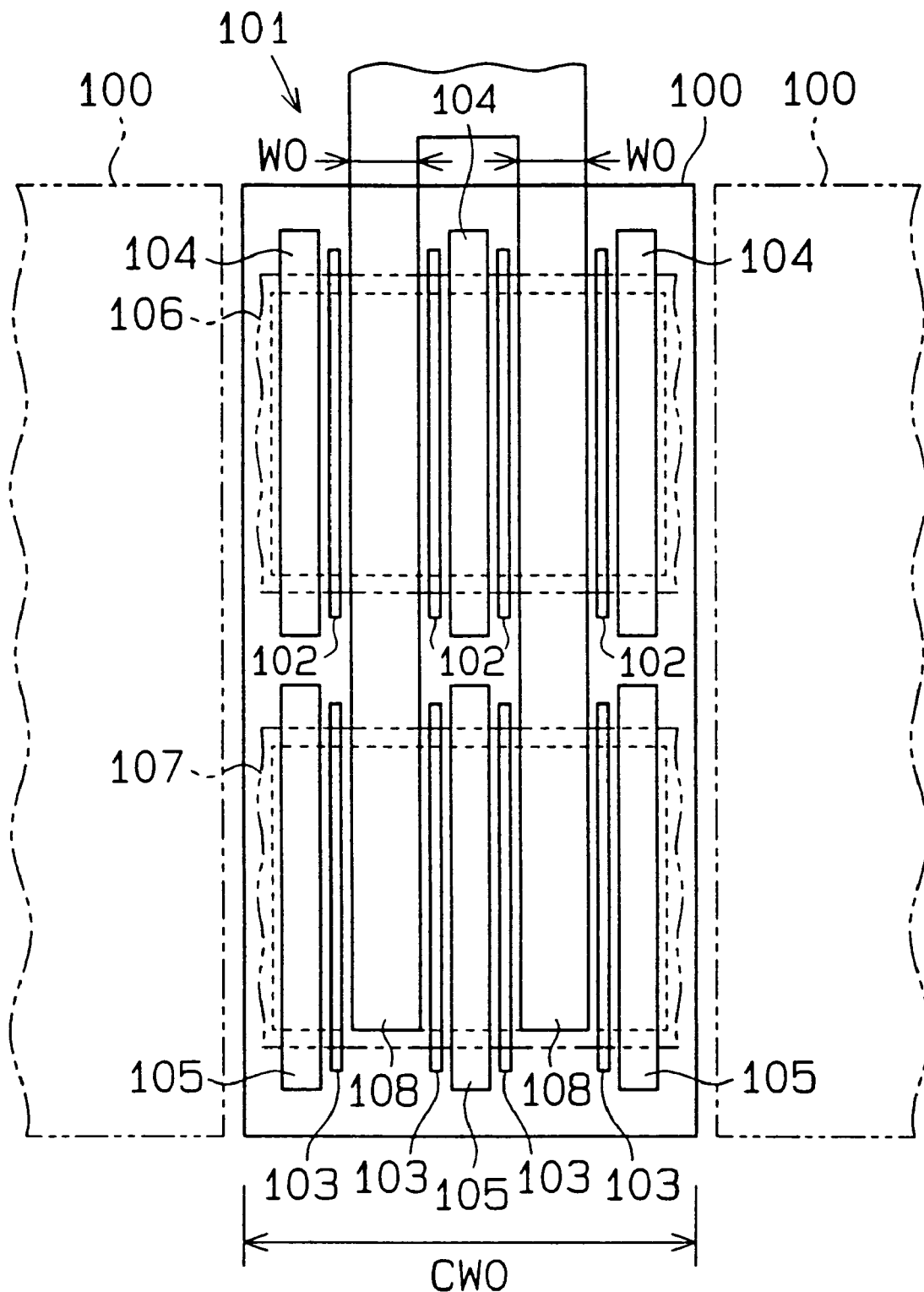
FIG. 1 shows a conventional output circuit provided in one I/O cell area on a CMOS gate array.
Figure 2:
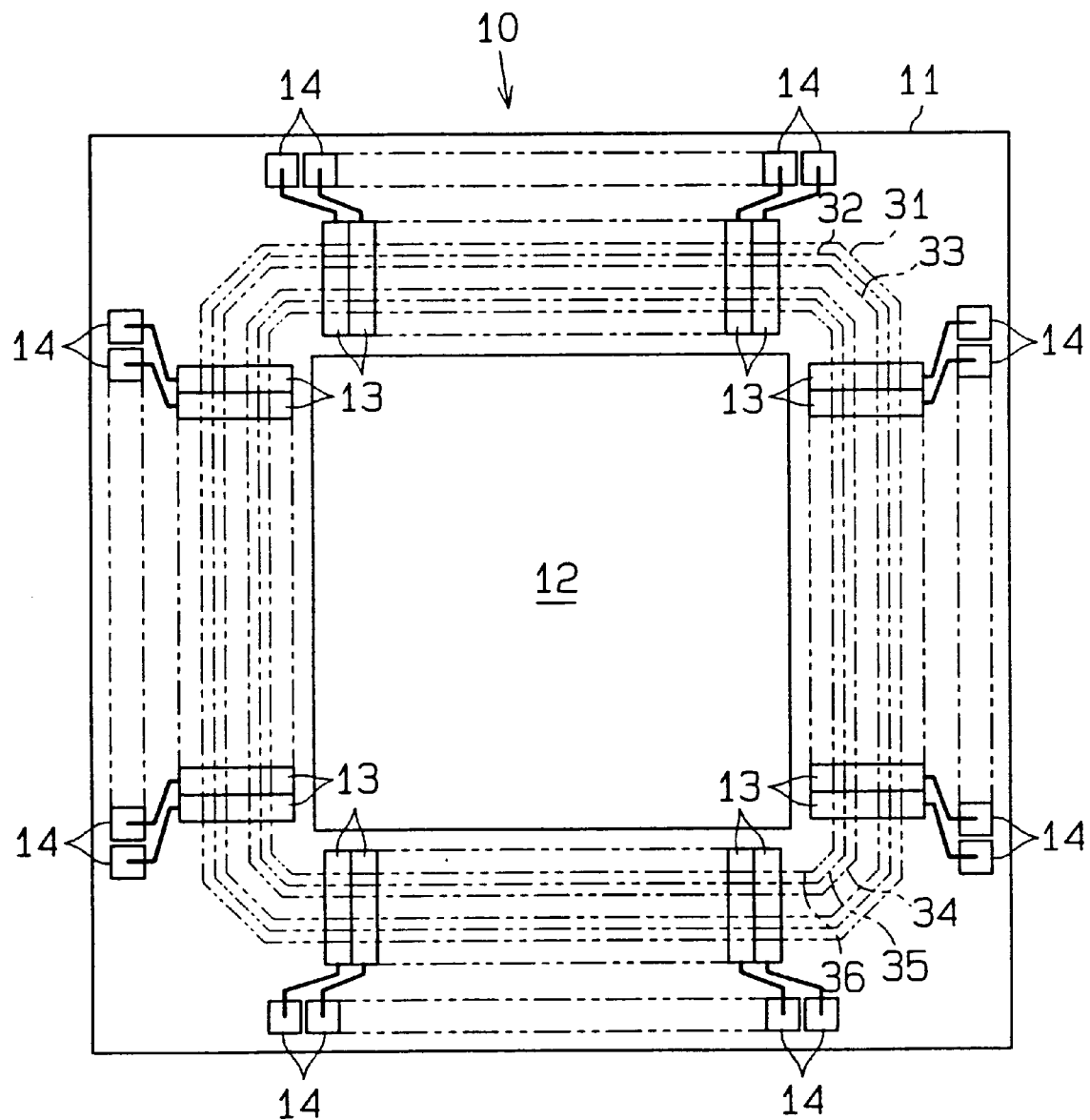
FIG. 2 illustrates a gate array as a semiconductor device.

FIG. 2 illustrates a gate array 10 as a semiconductor device. The gate array 10 has a rectangular semiconductor chip body 11 having four edges. A rectangular internal cell area 12 is defined on the center surface of the semiconductor chip body 11. A plurality of basic cells each having pMOS transistors and nMOS transistors are formed in the internal cell area 12. Various logic circuits are formed by single basic cells or combinations of the basic cells.

A plurality of external pads 14 are formed on the peripheral area of the semiconductor chip body 11 along the individual edges of the semiconductor chip body 11. The external pads 14 may be connected to associated I/O pins (not shown) by bonding wires or bumps (neither shown). The pitch between the adjacent external pads 14 is set to a predetermined value in the light of the performance of a bonding machine or a probe testing machine.

A plurality of I/O cell areas 13 are defined between the external pads 14 and the internal cell area 12 on the semiconductor chip body 11. The I/O cell areas 13 are arranged along the edges of the semiconductor chip body 11 and inward of the peripheral area on the semiconductor chip body 11 where the external pads 14 are formed. An input/output circuit 15 (see FIG. 3) is formed in each I/O cell area 13.

Located over the semiconductor chip body 11 are three annular power lines 31, 32 and 33 for supplying a low-potential supply voltage ($V_{SS}$) and three annular power lines 34, 35 and 36 for supplying a high-potential supply voltage ($V_{DD}$). Those power lines 31 to 36 are connected to the input/output circuits in the individual I/O cell areas 13. The power lines 31–36 are formed in a first metal interconnection layer 44 (see FIG. 4) which will be discussed later.

Figure 3:
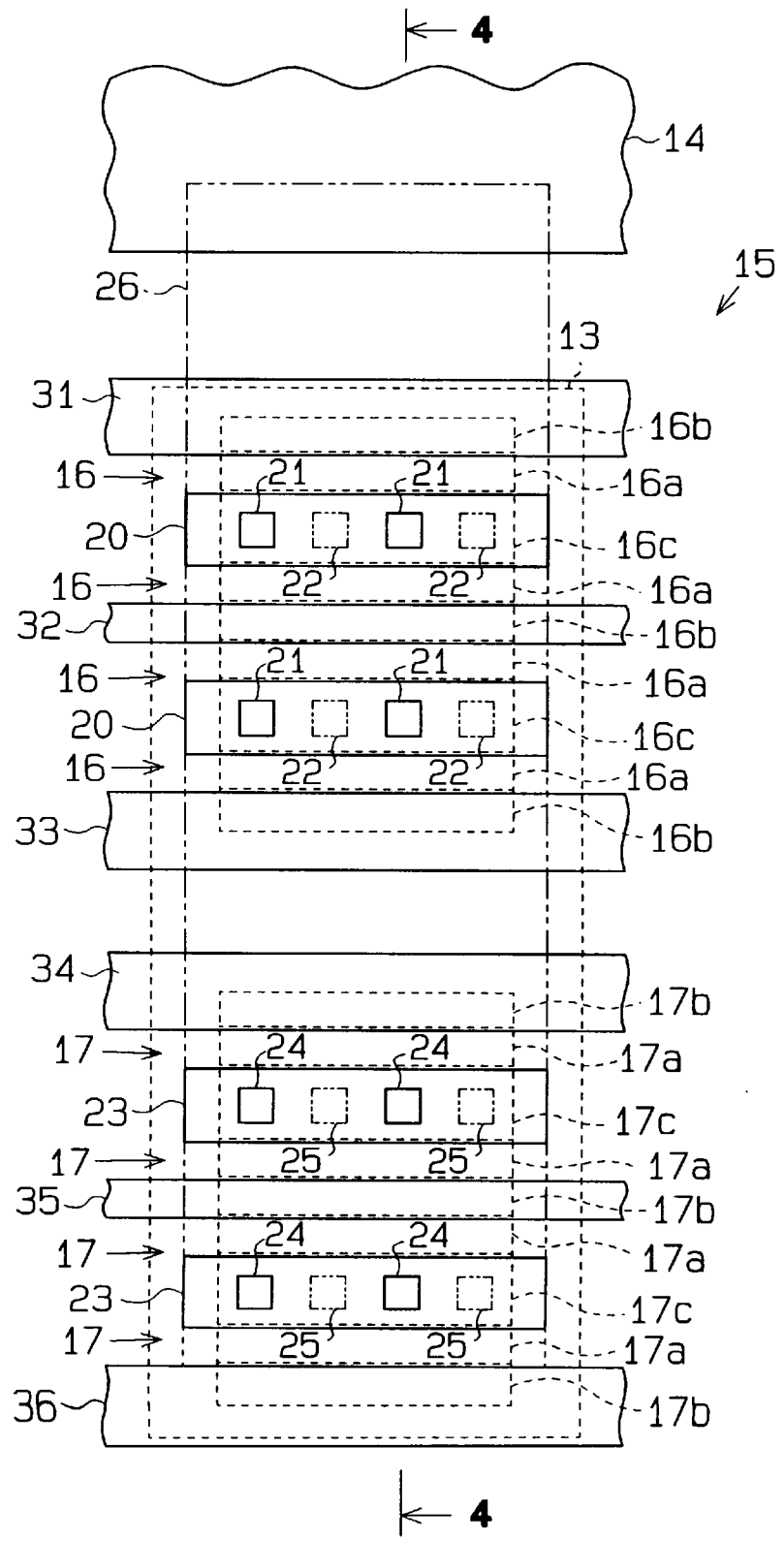
FIG. 3 is a plan view of an input/output circuit provided in an I/O cell area according to a first embodiment of the invention.
Figure 4:
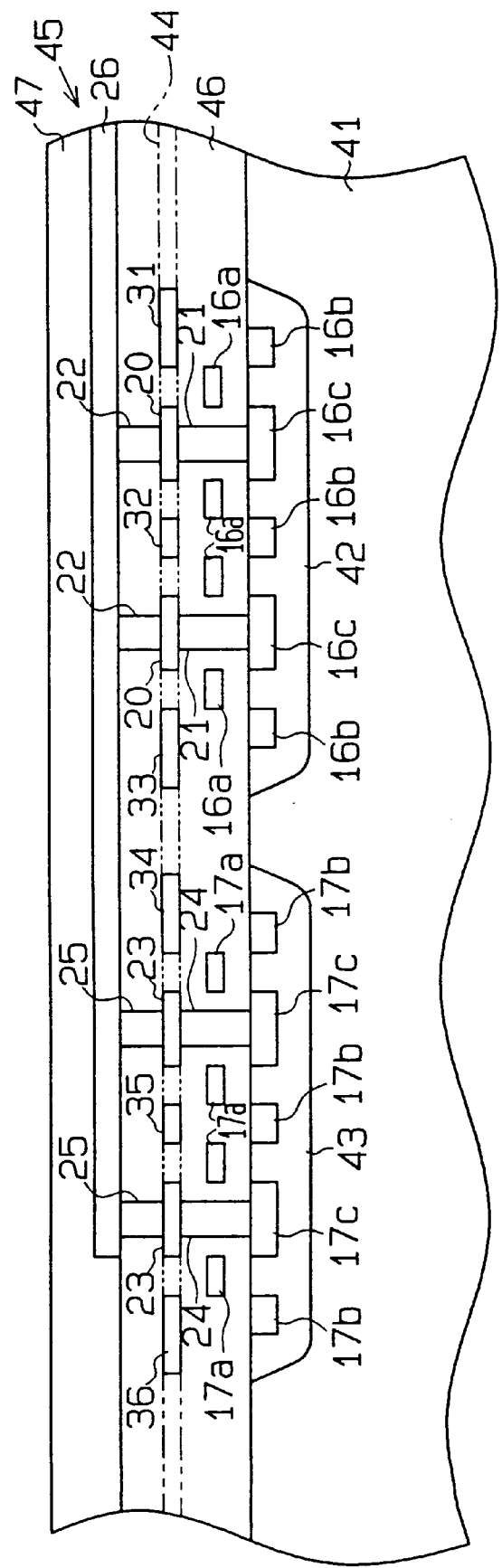
FIG. 4 is a cross-sectional view of the input/output circuit along the line 4—4 in FIG. 3.

FIG. 3 is a plan view of the input/output circuit provided in each I/O cell area 13. FIG. 4 is a cross-sectional view of the input/output circuit along the line 4—4 in FIG. 3. The input/output circuit includes four nMOS transistors 16 and four pMOS transistors 17. The individual nMOS transistors 16 and the individual pMOS transistors 17 are arranged in a row across (or in the width direction of) the associated cell area 13. That is, four nMOS transistors 16 are arranged in a row toward the internal cell area 12 from the associated edge of the semiconductor chip body 11, and four pMOS transistors 17 following those nMOS transistors 16 are arranged in a row in the same direction.

Each nMOS transistor 16 has three electrodes, including a gate 16a, a source 16b and a drain 16c. Every adjoining nMOS transistors 16 share one drain 16c. As shown in FIGS. 3 and 4, the gate 16a, source 16b and drain 16c are arranged in a row and in a predetermined order across the associated cell area 13.

Each pMOS transistor 17 has three electrodes, including a gate 17a, a source 17b and a drain 17c. Every adjoining pMOS transistors 17 share one drain 17c. The gate 17a, source 17b and drain 17c are arranged in a row and in a predetermined order across the associated cell area 13.

The power lines 31, 32 and 33 are located over the sources 16b of the individual nMOS transistors 16 and are electrically connected to the sources 16b via associated contacts (not shown). The power lines 34, 35 and 36 are located over the sources 17b of the individual pMOS transistors 17 and are electrically connected to the sources 17b via associated contacts (not shown).

Aluminum drain lines 20 formed in a first metal interconnection layer 44 are located over the common drains 16c of the individual nMOS transistors 16. Each drain line 20 is electrically connected to the associated drains 16c via associated contacts 21. Aluminum drain lines 23 formed in the first metal interconnection layer 44 are located over the common drains 17c of the individual pMOS transistors 17. Each drain line 23 is electrically connected to the associated drains 17c via associated contacts 24.

The power lines 31–36 and the drain lines 20 and 23 are so formed as to extend across the I/O cell areas 13 or along the associated edge of the semiconductor chip body 11.

An aluminum line 26 formed in a second metal interconnection layer 45 is located over the first metal interconnection layer 44. The aluminum line 26 is formed to extend along the I/O cell areas 13 or across (substantially perpendicular to) the associated edge of the semiconductor chip body 11.

More specifically, the aluminum line 26 is electrically connected to the associated external pad 14 via an associated contact (not shown) and is further electrically connected to the drain lines 20 and 23 via separate contacts 22 and 25. Therefore, the drains 16c of the individual nMOS transistors 16 are electrically connected to the associated external pad 14 via the associated contacts 21, drain lines 20, contacts 22 and aluminum lines 26. Further, the drains 17c of the individual pMOS transistors 17 are electrically connected to the associated external pad 14 via the associated contacts 24, drain lines 23, contacts 25 and aluminum lines 26. Accordingly, the output of each input/output circuit 15 is transferred to the associated external pad 14 via the associated aluminum line 26.

As mentioned above, each aluminum line 26 is provided to connect the drains 16c and 17c of the individual nMOS transistors and the individual pMOS transistors 17 to the associated external pad 14. This aluminum line 26 is formed substantially perpendicular to the power lines 31–36 to which the low-potential and high-potential supply voltages are supplied and in the metal interconnection layer which is different from that of the power lines. To improve the electromigration resistance, therefore, the aluminum line 26 having relatively wide width is effectively obtained without widening the I/O cell areas 13.

Further, the nMOS transistors 16 and the pMOS transistors 17 are arranged in a row across the associated cell area 13. It is therefore possible to effectively reduce the widths of the I/O cell areas 13 extending along the edges of the semiconductor chip body 11 or reduce the pitch between the adjoining I/O cell areas 13. This permits an increase in the number of I/O cell areas 13 which are defined along the edges of the semiconductor chip body 11, thus contributing to the accomplishment of the multi-pin structure of the gate array 10.

As shown in FIG. 4, a well 42 having a p-type conductivity and a well 43 having an n-type conductivity are defined on the surface of a chip substrate 41. The drains 16c and the source 16b both having an n$^+$-type conductivity are alternately defined on the surface of the p-type well 42. The drains 17c and the source 17b both having a p$^+$-type conductivity are alternately defined on the surface of the well 43.

Formed on the chip substrate 41 is a first insulator layer 46 in which the first metal interconnection layer 44 is provided. The gates 16a of polysilicon are provided above channels between the drains 16b and the sources 16c. The gates 17a of polysilicon are provided above channels between the drains 17b and the sources 17c in the first insulator layer 46.

Formed on the first insulator layer 46 is a second insulator layer 47 in which the second metal interconnection layer 45 is provided.

Figure 5:
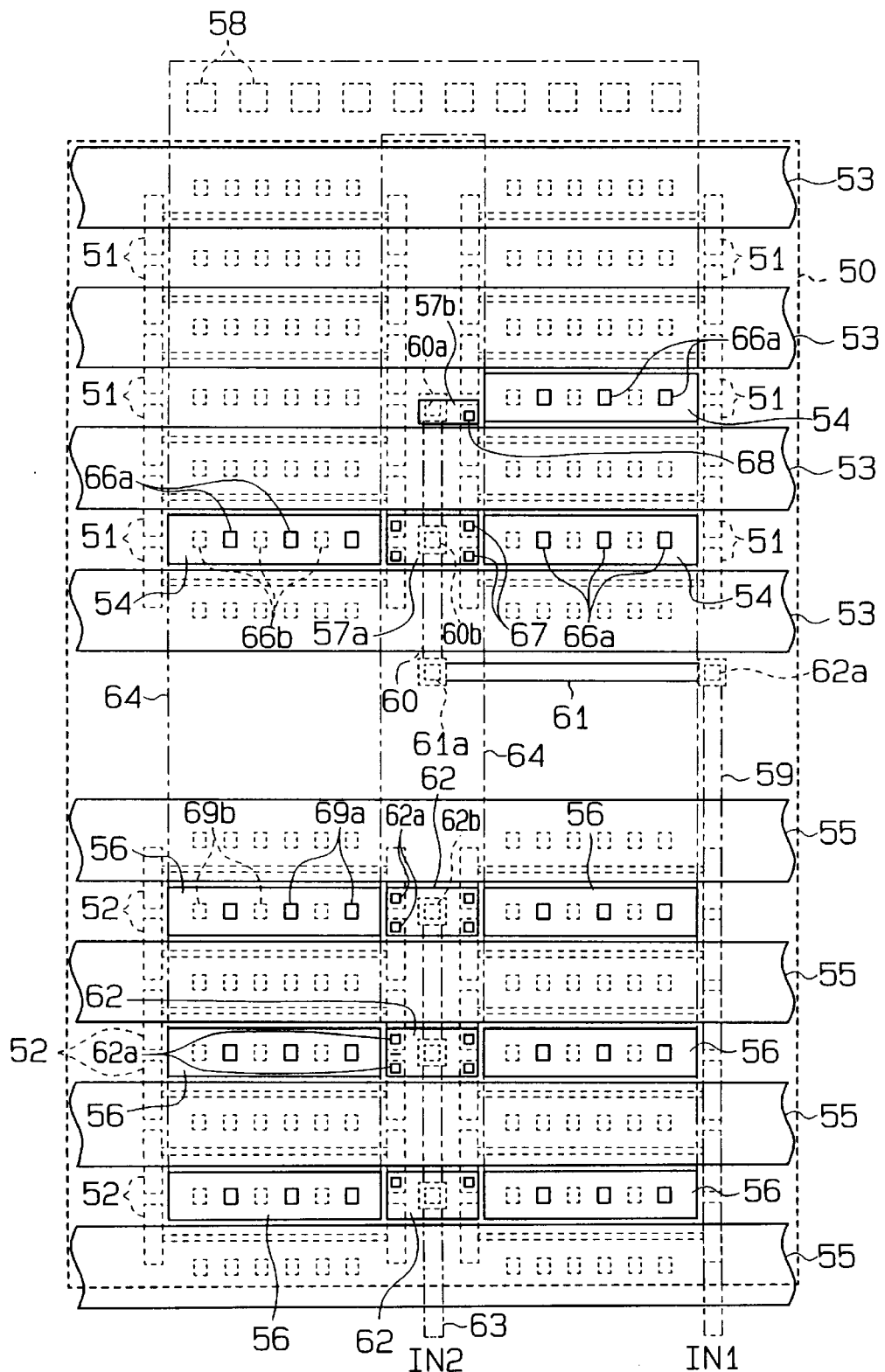
FIG. 5 is a plan view of an input/output circuit provided in an I/O cell area according to a second embodiment of the invention.

The second embodiment of this invention will now be described with reference to the accompanying drawings. As shown in FIG. 5, an input/output circuit according to the second embodiment includes twelve nMOS transistors 51 and twelve pMOS transistors 52. The twelve nMOS transistors 51 are separated into first and second nMOS transistor groups each comprising of six nMOS transistors 51. The twelve pMOS transistors 52 are separated into first and second pMOS transistor groups each comprising of six pMOS transistors 52.

The first and second nMOS transistor groups are arranged in two columns along (or in the lengthwise direction of) the associated I/O cell area 50. The six nMOS transistors 51 in each of the first and second nMOS transistor groups are arranged in a row across the associated I/O cell area 50. Those illustrated as the nMOS transistors 51 in FIG. 5 are the gates of the nMOS transistors. The gate, source and drain of each nMOS transistor 51 are arranged in a row in a predetermined order across the associated I/O cell area 50. The adjoining nMOS transistors 51 share the source and drain. Therefore, each of the first and second nMOS transistor groups has four sources and three drains.

The first and second pMOS transistor groups are arranged in two columns along (or in the lengthwise direction of) the I/O cell area 50 at predetermined distances from the first and second nMOS transistor groups. The six pMOS transistors 52 in each of the first and second pMOS transistor groups are arranged in a row across the associated I/O cell area 50. Those illustrated as the pMOS transistors 52 in FIG. 5 are the gates of the pMOS transistors. The gate, source and drain of each pMOS transistor 52 are arranged in a row in a predetermined order across the associated I/O cell area 50. The adjoining pMOS transistors 52 share the source and drain. Therefore, each of the first and second pMOS transistor groups has four sources and three drains.

Four power lines 53 for supplying a low-potential supply voltage ($V_{SS}$) are commonly located over the four sources of the first and second nMOS transistor groups. Three aluminum drain lines 54 are located over the three drains shared by the three sets of adjoining nMOS transistors 51 selected from the first and second nMOS transistor groups. The power lines 53 and the aluminum drain lines 54 are formed in a first metal interconnection layer. Each drain line 54 is electrically connected to the drains of the associated nMOS transistors 51 via three contacts 66a.

Two of the three drain lines 54 are located in the same row with a single first signal line 57a located between those two drain lines 54. Another single first signal line 57b is located in the vicinity of the remaining one drain line 54. The first signal lines 57a and 57b are formed in the first metal interconnection layer. The first signal line 57a is electrically connected via four contacts 67 to the gates of four nMOS transistors 51 in the selected three sets of nMOS transistors 51. The first signal line 57b is electrically connected via one contact 68 to the gate of one nMOS transistor 51 in the selected three sets of nMOS transistors 51.

Second signal lines 59 and 60 of aluminum are formed in a second metal interconnection layer located above the first metal interconnection layer. A third signal line 61 of aluminum is formed in the first metal interconnection layer between the first and second nMOS transistor groups and the first and second pMOS transistor groups. The third signal line 61 is electrically connected to the second signal lines 59 and 60 via contacts 61a and 61b. The second signal line 60 is further electrically connected to the first signal lines 57a and 57b via contacts 60a and 60b. Accordingly, a first signal IN1 is supplied to the gates of five selected nMOS transistors 51 via the first to third signal lines 57a, 57b, 59, 60 and 61.

Four power lines 55 for supplying a high-potential supply voltage ($V_{DD}$) are commonly located over the four sources of the first and second pMOS transistor groups. Six aluminum drain lines 56 are located over the six drains shared by the six sets of adjoining pMOS transistors 52 selected from the first and second pMOS transistor groups. The drain lines 56 are formed in the first metal interconnection layer and are each electrically connected to the drains of the associated pMOS transistors 52 via three contacts 69a.

Each pair of the six drain lines 56 are located in the same row with a single fourth signal line 62 located between that pair of drain lines 56. The individual fourth signal lines 62 are formed in the first metal interconnection layer. Each of two of the three fourth signal lines 62 is electrically connected via four contacts 62a to the gates of four pMOS transistors 52. The remaining one fourth signal line 62 is electrically connected via two contacts 62a to the gates of two pMOS transistors 52.

A fifth signal line 63 of aluminum is formed in the second metal interconnection layer located above the first metal interconnection layer. The fifth signal line 63 is electrically connected to the three fourth signal lines 62 via three contacts 62b. Accordingly, a second signal IN2 is supplied to the gates of ten selected pMOS transistors 52 via the third and fourth signal lines 62 and 63.

An aluminum line 64 so formed as to extend along the associated I/O cell area 50 is located over the drain lines 54 and 56. This aluminum line 64 is formed in the second metal interconnection layer. The aluminum line 64 is electrically connected to the associated external pad (not shown) via a contact 58. The aluminum line 64 is further electrically connected to the drain lines 54 and 56 via contacts 66b and 69b. In this manner, the drains of the nMOS transistors 51 and the pMOS transistors 52 are electrically connected to the associated external pad via the drain lines 54 and 56 and the aluminum line 64.

Figure 6:
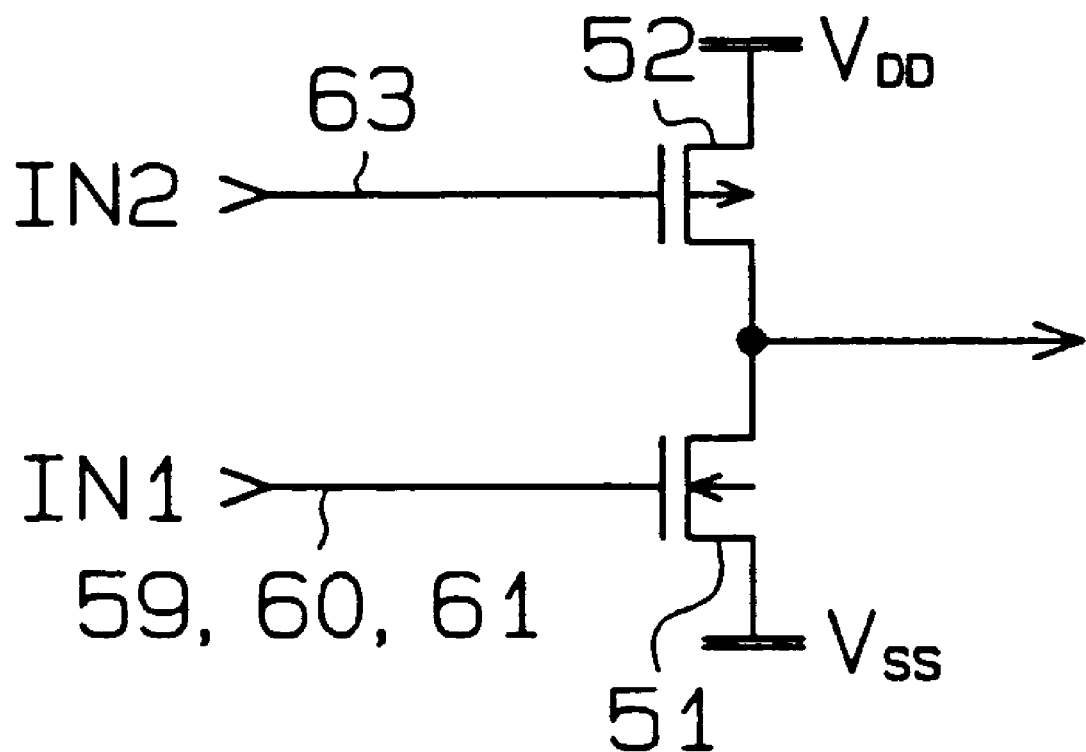
FIG. 6 shows an equivalent circuit of an output circuit portion of the input/output circuit in FIG. 5.

FIG. 6 presents an equivalent circuit showing an output circuit located in the I/O cell area 50 in FIG. 5. Since selected five nMOS transistors 51 are connected in parallel, they are illustrated as a single nMOS transistor 51 in this equivalent circuit. Likewise, because selected ten pMOS transistors 52 are connected in parallel, they are illustrated as a single pMOS transistor 52.

The second embodiment has the same advantages as the first embodiment. As the first and second signal lines 57a, 57b, 59 and 60 and the fourth signal lines 63 which are used to transfer the first and second signals IN1 and IN2 are formed on the metal interconnection layer which differs from that of the power lines 53 and 55. Therefore, there is a relatively small electric influence of the power lines 53 and 55 on those signal lines.

Figure 7:
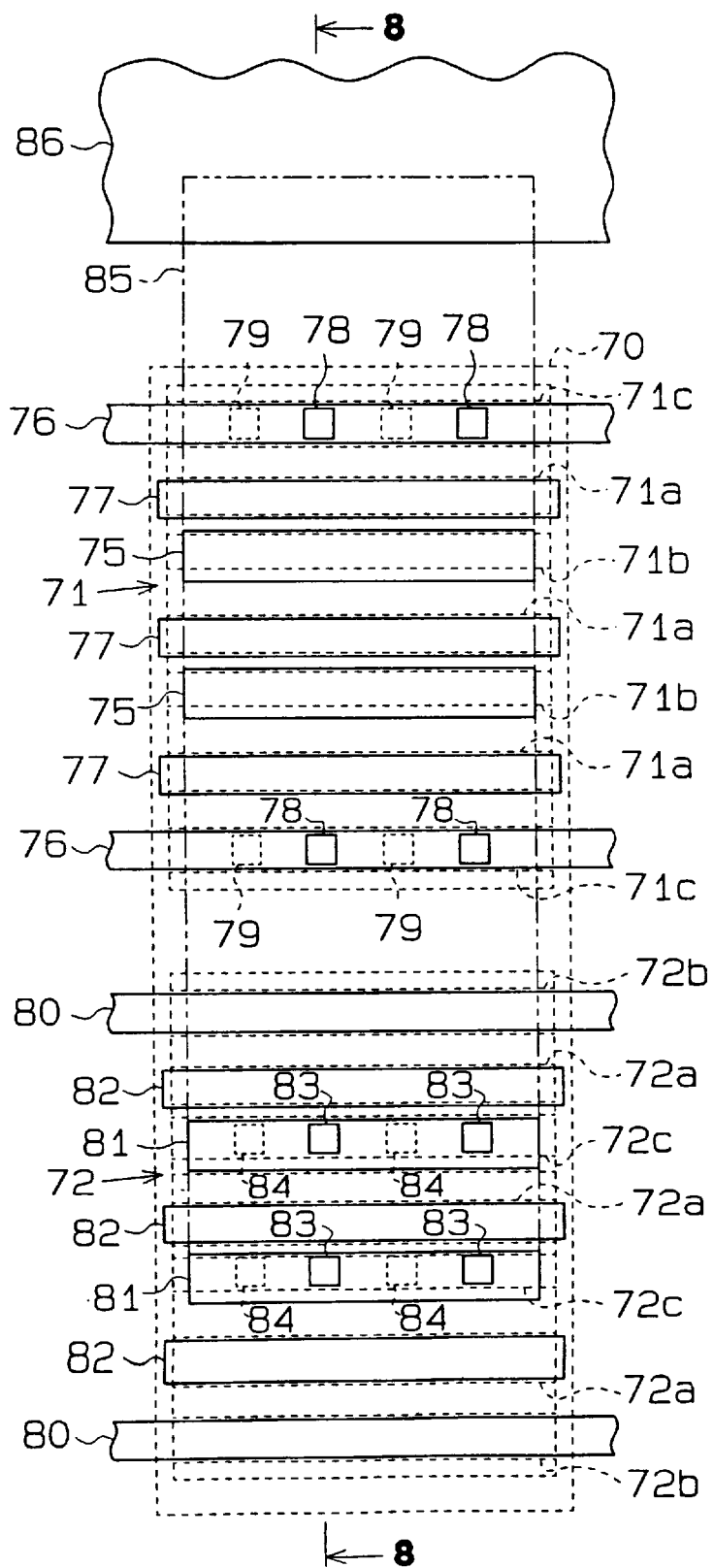
FIG. 7 is a plan view of an input/output circuit provided in an I/O cell area according to a third embodiment of the invention.
Figure 8:
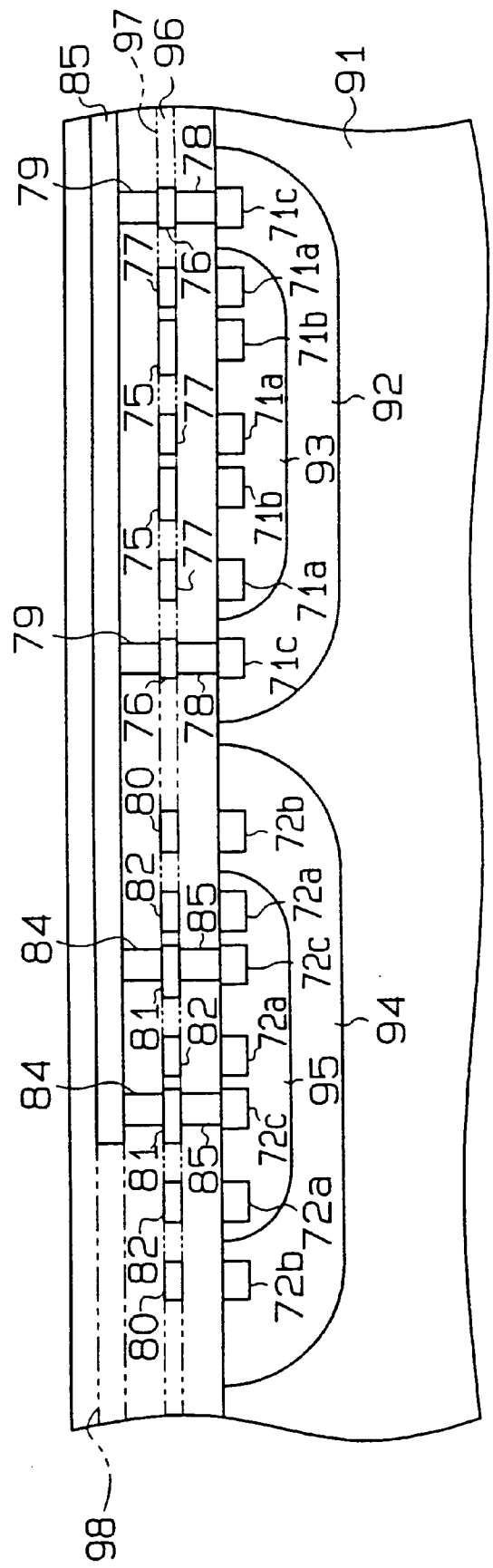
FIG. 8 is a cross-sectional view of the input/output circuit along the line 8—8 in FIG. 7.

The third embodiment of this invention will now be described with reference to the accompanying drawings. FIG. 7 is a plan view of an input/output circuit provided in each I/O cell area 70. FIG. 8 is a cross-sectional view of the input/output circuit along the line 8—8 in FIG. 7. The input/output circuit according to the third embodiment includes an npn transistor 71 and a pnp transistor 72. The npn transistor 71 and the pnp transistor 72 are arranged in a row across the associated I/O cell area 70.

The npn transistor 71 has three base contacts 71a, two emitters 71b and two collector contacts 71c. Those base contacts 71a, emitters 71b and collector contacts 71c are arranged in a row in a predetermined order across the I/O cell area 70. The pnp transistor 72 has three base contacts 72a, two emitter contacts 72b and two collectors 72c. Those base contacts 72a, emitter contacts 72b and collectors 72c are arranged in a row in a predetermined order across the I/O cell area 70.

Two power lines 75 for supplying a low-potential supply voltage ($V_{SS}$) are located over the two emitter contacts 71b of the npn transistor 71. Both power lines 75 are formed in a first metal interconnection layer 97 (see FIG. 8) and are electrically connected to the two emitter contacts 71b via a plurality of contacts (not shown), respectively. Two aluminum collector lines 76 are located over the two collector contacts 71c. Both collector lines 76 are formed in the first metal interconnection layer 97 and are electrically connected to the two collector contacts 71c via a plurality of contacts 78, respectively. Three aluminum base lines 77 are located over the three base contacts 71a. The three base lines 77 are formed in the first metal interconnection layer 97 and are electrically connected to the three base contacts 71a via a plurality of contacts (not shown), respectively.

Two power lines 80 for supplying a high-potential supply voltage ($V_{DD}$) are located over the two emitter contacts 72b of the pnp transistor 72. Both power lines 80 are formed in the first metal interconnection layer 97 and are electrically connected to the two emitter contacts 72b via a plurality of contacts (not shown), respectively. Two aluminum collector lines 81 are located over the two collectors 72c. Both collector lines 81 are formed in the first metal interconnection layer 97 and are electrically connected to the two collectors 72c via a plurality of contacts 83, respectively. Three aluminum base lines 82 are located over the three base contacts 72a. The three base lines 82 are formed in the first metal interconnection layer 97 and are electrically connected to the three base contacts 72a via a plurality of contacts (not shown), respectively.

A second metal interconnection layer 98 is disposed above the first metal interconnection layer 97. An aluminum line 85 so formed as to extend along the I/O cell area 70 or across the associated edge of the semiconductor chip body 11 is located in the second metal interconnection layer 98. The aluminum line 85 is electrically connected to an associated external pad 86 via a contact (not shown). The aluminum line 85 is further electrically connected to two collector lines 76 via a plurality of contacts 79 and electrically connected to two collector lines 81 via contacts 84. Accordingly, the collector contacts 71c of the npn transistor 71 and the collectors 72c of the pnp transistor 72 are electrically connected to the external pad 86 via the collector lines 76 and 81 and the aluminum line 85.

As shown in FIG. 8, a collector region 92 having an n-type conductivity and an emitter region having a p-type conductivity are defined on the surface of a chip substrate 91. The two collector contacts 71c having an $n^+$ conductivity and a base region 93 having a p-type conductivity are defined on the surface of the collector region 92. The three base contacts 71a having a $p^+$ conductivity and the two emitter contacts 71b having an $n^+$-type conductivity are alternately defined on the surface of the base region 93. The two emitter contacts 72b having a $p^+$ conductivity and a base region 95 having an n-type conductivity are defined on the surface of the emitter region 94. The three base contacts 72a having an $n^+$ conductivity and the collectors 72c having a $p^+$-type conductivity are alternately defined on the surface of the base region 95.

Formed on the chip substrate 91 is an insulator layer 96. Formed in the insulator layer 96 are the first metal interconnection layer 97 in which the power lines 75 and 80, the collector lines 76 and 81 and the base lines 77 and 82 are formed, and the second metal interconnection layer 98 in which the aluminum line 85 is formed.

As mentioned above, the aluminum line 85 for transferring the output of the input/output circuit to the associated external pad 86 is formed substantially perpendicular to the power lines 75 and 80 to which the low-potential and high-potential supply voltages are supplied and in the metal interconnection layer which differs from that of the power lines. To improve the electromigration resistance, therefore, the aluminum line 85 having a relatively wide width can effectively be obtained without widening the I/O cell areas 70. Further, the npn transistor 71 and the pnp transistor 72 are arranged in a row across the associated I/O cell area 70. It is therefore possible to effectively reduce the widths of the I/O cell areas 70 which extend along the edges of the semiconductor chip body or reduce the pitch between the adjoining I/O cell areas 70. This permits an increase in the number of I/O cell areas 70 which are defined along the edges of the semiconductor chip body, thus contributing to the accomplishment of the multi-pin structure of the gate array.

Although several embodiments of the present invention have been described herein, it should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A semiconductor device comprising:

a semiconductor chip body having a surface;

a plurality of input/output cell areas, each having a length, arranged on said surface of said semiconductor chip body;

input/output circuits respectively formed in said input/ output cell areas and each having a plurality of transistors with three electrodes, said transistors being arranged in a row across said associated input/output cell area, said three electrodes of each of said transistors being arranged in a row across said associated input/output cell area;

a first line, electrically connected to a first electrode among said three electrodes of each of said transistors, for supplying a predetermined supply voltage to said transistors, said first line being so formed over said surface of said semiconductor chip body as to extend substantially perpendicularly across said length of said associated input/output cell area;

a second line electrically connected to a second electrode among said three electrodes of each of said transistors and formed over and substantially perpendicular to said first line; and an I/O pad electrically connected to said second line.

2. The semiconductor device according to claim 1, wherein said transistors are MOS transistors and said three electrodes are a source, a drain and a gate.

3. The semiconductor device according to claim 1, wherein said transistors are bipolar transistors and said three electrodes are a base, an emitter and a collector.

4. The semiconductor device according to claim 1, wherein said transistors are MOS transistors, said three electrodes are a source, a drain and a gate, and wherein said source is said first electrode.

5. The semiconductor device according to claim 1, wherein said transistors are bipolar transistors, said three electrodes are a base, an emitter and a collector, and wherein said emitter is said first electrode.

6. The semiconductor device according to claim 1, wherein said transistors are MOS transistors, said three electrodes are a source, a drain and a gate, and wherein said source is said first electrode and said drain is said second electrode.

7. The semiconductor device according to claim 1, wherein said transistors are bipolar transistors, said three electrodes are a base, an emitter and a collector, and wherein said emitter is said first electrode and said collector is said second electrode.

8. The semiconductor device according to claim 1, wherein said second line is so formed as to extend along the length of said associated input/output cell area.

9. The semiconductor device according to claim 1, wherein said first line is in a first metal layer of said semiconductor device, and said second line is in a second metal layer of said semiconductor device.

10. A semiconductor device comprising:

a semiconductor chip package having a surface;

a plurality of input/output cell areas arranged on an outer periphery of said surface of said semiconductor chip package;

input/output circuits respectively formed in said input/output cell areas and each having a plurality of transistor groups including first and second transistor groups, each of said first and second transistor groups including transistors with three electrodes, said first and second transistor groups being arranged in a row along said associated input/output cell area, said transistors in said first and second transistor groups being arranged in a row across said associated input/output cell area, said three electrodes of each of said transistors being arranged in a row across said associated input/output cell area;

a first line, electrically connected to a first electrode among said three electrodes of each of said transistors in said first and second transistor groups, for supplying a predetermined supply voltage to said transistors, said first line being so formed over said surface of said semiconductor chip body as to extend across a width of said associated input/output cell area;

at second line electrically connected to a second electrode among said three electrodes of each of said transistors and located over and substantially perpendicular to said first line; and an I/O pad electrically connected to said second line.

11. The semiconductor device according to claim 10, wherein said transistors are MOS transistors and said three electrodes are a source, a drain and a gate.

12. The semiconductor device according to claim 10, wherein said transistors are bipolar transistors and said three electrodes are a base, an emitter and a collector.

13. The semiconductor device according to claim 12, wherein said transistors are MOS transistors, said three electrodes are a source, a drain and a gate, and wherein said source is said first electrode.

14. The semiconductor device according to claim 12, wherein said transistors are bipolar transistors, said three electrodes are a base, an emitter and a collector, and wherein said emitter is said first electrode.

15. The semiconductor device according to claim 12, wherein said transistors are MOS transistors, said three electrodes are a source, a drain and a gate, and wherein said source is said first electrode and said drain is said second electrode.

16. The semiconductor device according to claim 12, wherein said transistors are bipolar transistors, said three electrodes are a base, an emitter and a collector and, wherein said emitter is said first electrode and said collector is said second electrode.

17. The semiconductor device according to claim 12, wherein said second line is so formed as to extend along the length of said associated input/output cell area.

18. The semiconductor device according to claim 12 further comprising a third line electrically connected to a third electrode among said three electrodes of at least one of said transistors selected from said first and second transistor group, said third line being located at substantially the same level in said semiconductor device as said first line.

19. The semiconductor device according to claim 10, wherein said transistors are MOS transistors, said three electrodes are a source, a drain and a gate, and wherein said source is said first electrode, said drain is said second electrode, and said gate is said third electrode.

20. The semiconductor device according to claim 10, wherein said transistors are bipolar transistors, said three electrodes are a base as said third electrode, an emitter and a collector, and wherein said emitter is said first electrode, said collector is said second electrode, and said base is said third electrode.

21. The semiconductor device according to claim 10, wherein said first line is in a first metal layer of said semiconductor device, and said second line is in a second metal layer of said semiconductor device.

* * * * *